(12) United States Patent
Rahman et al.

(10) Patent No.: US 7,937,058 B2
(45) Date of Patent: May 3, 2011

(54) CONTROLLING THE BANDWIDTH OF AN ANALOG FILTER

(75) Inventors: Mahibur Rahman, Lake Worth, FL (US); John J. Parkes, Jr., Boynton Beach, FL (US); James J. Riches, Lake Worth, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 706 days.

(21) Appl. No.: 11/550,534

(22) Filed: Oct. 18, 2006

(65) Prior Publication Data

US 2008/0096514 A1    Apr. 24, 2008

(51) Int. Cl.
*H04B 1/10* (2006.01)
(52) U.S. Cl. .................. 455/307; 455/296; 455/334
(58) Field of Classification Search .................. 455/296, 455/307, 334; 375/146, 240, 328–331
See application file for complete search history.

(56) References Cited

U.S. PATENT DOCUMENTS

| 5,187,445 | A | 2/1993 | Jackson ......................... 328/167 |
| 5,245,646 | A | 9/1993 | Jackson et al. ..................... 377/2 |
| 5,625,316 | A | 4/1997 | Chambers et al. ............. 327/553 |
| 5,822,687 | A | 10/1998 | Bickley et al. ............. 455/226.7 |
| 5,914,633 | A | 6/1999 | Comino et al. ................ 327/553 |
| 6,229,889 | B1 * | 5/2001 | Cannon et al. ................. 375/328 |
| 6,356,142 | B1 | 3/2002 | Mittel ........................... 327/553 |
| 6,370,244 | B1 | 4/2002 | Felder et al. |
| 6,417,727 | B1 | 7/2002 | Davis ........................... 327/553 |
| 6,560,447 | B2 | 5/2003 | Rahman et al. ............. 455/232.1 |
| 6,628,163 | B2 | 9/2003 | Dathe et al. .................... 327/553 |
| 6,677,814 | B2 | 1/2004 | Low et al. ....................... 327/554 |
| 6,766,150 | B1 * | 7/2004 | Johnson ........................... 455/87 |
| 6,937,089 | B2 | 8/2005 | Riches .......................... 327/553 |
| 6,965,275 | B2 | 11/2005 | Di Giandomenico et al. ............................ 333/17.1 |
| 7,002,404 | B2 | 2/2006 | Gaggl et al. ................... 327/553 |
| 7,002,427 | B2 * | 2/2006 | Nystrom et al. ............. 333/17.1 |
| 7,050,781 | B2 | 5/2006 | Khalil et al. .................. 455/340 |
| 2003/0174783 | A1 | 9/2003 | Rahman et al. ............... 375/298 |

(Continued)

FOREIGN PATENT DOCUMENTS

WO    WO 2006012271 A1 *  2/2006

OTHER PUBLICATIONS

International Search Report for correlating PCT Patent Application No. PCT/US 07/77169 dated Mar. 20, 2008.

(Continued)

*Primary Examiner* — Lana N Le

(57) ABSTRACT

A digital tuning system (250) for changing a cutoff frequency of an analog filter (132) includes digital synthesizers (292 and 294) for producing a two-tone calibration signal (196) applied to an input of the filter after a quality factor of the filter is increased. The filter includes at least one R/C circuit with two resistors (304 and 306) for changing the quality factor and arrays (308 and 310) of capacitors for changing the cutoff frequency. The amplitude of the magnitude responses (409 and 411) of the filter to each tone (405 and 407) is measured by a two discrete Fourier transform single-frequency bin power detection circuits (253 and 254) while the filter is sequenced through a plurality of capacitance settings. An optimal capacitance for the R/C circuit is selected by comparing, to a pre-selected value, a difference between the responses of the filter to each tone, for each capacitance setting.

8 Claims, 8 Drawing Sheets

U.S. PATENT DOCUMENTS

2004/0198288 A1    10/2004  Sadowski
2004/0234001 A1    11/2004  Huynh et al. ................. 375/260
2005/0123036 A1*    6/2005  Rahman et al. ............... 455/307
2008/0070539 A1*    3/2008  He et al. ....................... 455/305

OTHER PUBLICATIONS

Lindfors et al., "A 3-V Continuous-Time Filter with Op-Chip Tuning for IS-95," *IEEE Journal of Solid-State Circuits*, vol. 34, No. 8, Aug. 1999, pp. 1150-1154.

Yamazaki et al., "WP23.1 A 450kHz CMOS Gm-C Bandpass Filter with +/0.5% Center Frequency Accuracy for On-Chip PDC IF Receivers," *1999 IEEE International Solid-State Circuits Conference*, ISSCC99/Session 23/Paper WP 23.1, pp. 392-393, p. 482.

Durham et al., "Circuit Architectures for High Linearity Monolithic Continuous-Time Filtering," *IEEE Transactions on Circuits and Systems-II: Analog and Digital Signal Processing*, vol. 39, No. 9, Sep. 1992, pp. 651-657.

Yu et al., "Practical Treatise on the Tow-Thomas Biquad Active Filter," *CE170 Communications Systems Laboratory*, Aug. 2001, pp. 1-3.

EPC Supplementary Search Report For EP Application No. EP07841572, Mailed Dec. 2, 2009.

Elhallabi, H., "High Frequency and High Q CMOS GM-C Bandpass Filter with Automatic On-Chip Tuning", Microelectronics, 2001. ICM 2001 Proceedings. The 13th International Conference, Oct. 29-31, 2001, IEEE, Oct. 29, 2001, pp. 169-172.

* cited by examiner

CONTROLLING THE BANDWIDTH OF AN ANALOG FILTER

BACKGROUND OF THE INVENTION

1. Field of the Invention

This invention generally relates to analog filters, and more particularly to tuning an analog filter using a digital circuit.

2. Description of the Related Art

Continuous-time, or analog, filters are often used in wireless devices such as cellular telephones. Typically, the analog filter and other circuits comprising a receiver or a transmitter are on a single integrated circuit manufactured using complementary metal oxide semiconductor (CMOS) technology. The analog filter comprises components, including resistors and capacitors, that affect a bandwidth of the analog filter. Integrated circuit manufacturing or fabrication processes may cause the actual value of such components to vary by as much as 30% from their nominal value, which may cause bandwidth variations by as much as 50%. The bandwidth variations may also be caused by temperature or voltage changes. Variations in the bandwidth of the analog filter may lead to significant performance degradation in both receive and transmit signal paths of the wireless device. In the receive signal path, variations in the bandwidth of a baseband analog filter leads to performance degradation in static sensitivity, sensitivity in the presence of interferers, receiver third-order intercept point, anti-aliasing performance and error vector magnitude (EVM). In the transmit signal path, variations in the bandwidth of the baseband analog filter leads to performance degradation in the EVM, adjacent channel leakage ratio, and static/transient power mask performance.

Bandwidth tracking accuracy and performance are essential in wideband code-division multiple access (WCDMA or 3G) and high-speed downlink packet access (HSDPA or 3.5G) receivers to preserve necessary 0.1% bit error rate (BER), 5% EVM, interferer rejection, and analog-to-digital (A/D) anti-aliasing protection. In known 3G and 3.5G transceivers, the 0.1% BER sensitivity is degraded by as much as 0.5-decibel (dB) and EVM is degraded from 2% to 8.4%, due to large receiver bandwidth tracking errors of up to 12.5%.

A tracking loop is generally used to vary R/C filter parameters of an analog filter. The tracking loop tracks the variation in component values that may occur. The tracking accuracy of some known methods is limited due to a variance in a pseudorandom calibration signal and due to long term averaging needed for the tracking loop to converge. The total calibration time of known methods that use a pseudorandom calibration signal is approximately 10-msec, which is disadvantageously long. In spite of the long calibration time of known methods, it is difficult for known methods to achieve high calibration accuracy because of a variance in the pseudorandom signal.

Other known bandwidth tracking techniques focus on the concept of master-slave tracking. Such techniques use a filter stage configured as an oscillator with the exact same topology as the circuit used in sections of a main filter. Any manufacturing process and/or temperature variations should affect the main filter and the slave circuit by the same amount. This technique establishes, in essence, a phase-locked loop around the slave and keeps the oscillation of the oscillator (or the phase difference of the filter) always close to a stable value by tuning all the resistors (or capacitors) of the main filter. Such techniques rely on a matching between the various sections of the main filter and the slave circuit. However, precise matching is not always possible because the main filter occupies a different portion of a die than does the oscillator, and the lack of matching leads to performance degradation in the tracking accuracy.

Other known designs use an in-band tone and a band-edge tone to tune a filter. In such designs, the in-band tone provides a reference against which the band-edge tone is measured. Such designs require additional time because separate, non-concurrent measurements are required because the signals are not presented in a composite format. Furthermore, correction accuracy is lost because the slope of the magnitude response of the filter is low. In addition, as the filter is tuned lower in frequency, the amplitude of the band-edge calibration signal drops off, further reducing the resolution.

Some known resistor/capacitor (R/C) tuning systems use a dedicated analog oscillator that tracks the R/C time constant stages (biquad and mixer pole) that require tuning. The R/C time constant of the oscillator is measured using a comparator output that forces control logic of the tuning system to check the value of a digital timer and determine whether the R/C time constant of the oscillator is tuned optimally. Based on whether the R/C time constant is too slow, too fast, or within tolerance, a digital accumulator is decremented, incremented, or left unchanged, respectively. Disadvantageously, dedicated analog circuitry is required to perform the R/C time constant measurement, and the complexity of the required analog circuitry is more critical than digital circuitry. An increase in analog circuitry disadvantageously increases design time, die area and current drain.

Known digital tracking methods use a fast Fourier transform (FFT) method for power detection; however, the FFT method disadvantageously causes a significant amount of hardware cost and current drain.

Furthermore, all known methods lack any dynamic control of the quality factor (Q) of the active filter, to improve tracking performance.

DETAILED DESCRIPTION OF THE EXEMPLARY EMBODIMENT

Figure 1:
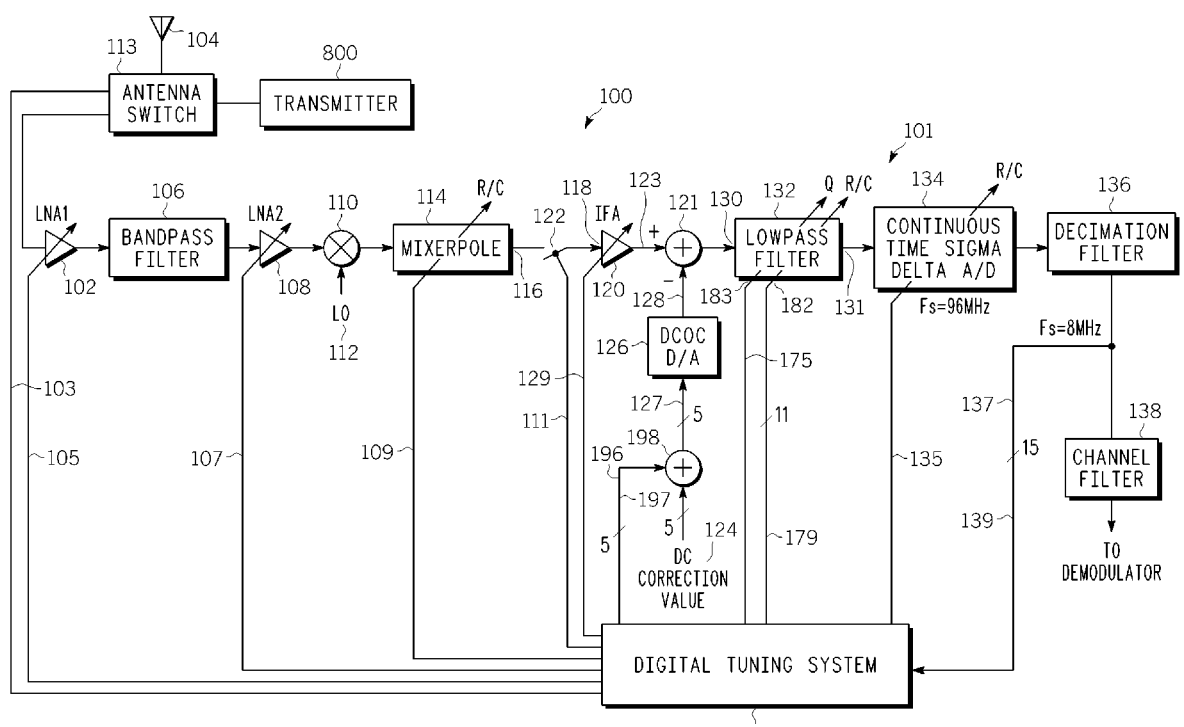
FIG. 1 is a simplified functional block diagram of a portion of a transceiver including a receiver with an analog filter, and a digital tuning system for tuning the analog filter.

FIG. 1 is a simplified functional block diagram of a transceiver 100, including a portion of a zero-IF, or baseband, receiver 101. In an exemplary embodiment, the transceiver 100 is a mobile, or wireless, telephone. The receiver 101 includes a first low noise amplifier (LNA) 102 coupled to an antenna 104 through an antenna switch 113, a bandpass filter 106 coupled to the first LNA, a second LNA 108 coupled to the bandpass filter, a mixer 110 coupled to a local oscillator 112 and to the second LNA, and a mixer pole 114 coupled to the mixer. The mixer pole 114 has an output 116 that is coupled to an input 118 of a baseband, or intermediate frequency, amplifier (IFA) 120 via a switch 122. The IFA 120 has an output 123. A digital DC correction value 124 is inserted into an input of a DC offset correction (DCOC) digital-to-analog (D/A) converter 126 via a five-bit coupling 127. The output signal of the DCOC D/A converter 126 is a dcoc_dac_out 128. As more fully explained hereinbelow, the DC correction value 124 is combined with a two-tone training, or calibration, signal 196 in accordance with the invention. The output 123 of the IFA 120 and the dcoc_dac_out 128 of the DCOC D/A converter 126 are combined at an adder 121 and fed into an input 130 of a baseband continuous-time, or analog, filter 132. The analog filter 132 is a lowpass filter and includes at least one bandwidth-determining R/C circuit. An output 131 of the analog filter 132 is coupled to a continuous-time sigma delta A/D converter 134, which has a sampling frequency of 96-MHz in the exemplary embodiment. The A/D converter 134 is coupled to a decimation filter 136 that eliminates aliases at a lower sampling frequency. The lower sampling frequency in the exemplary embodiment is 8-MHz. The decimation filter is coupled to a channel filter 138. The channel filter 138 is coupled to a demodulator (not shown). A transmitter 800 is also coupled to the antenna switch 113. A digital tracking, or tuning, system 250 for controlling, or tuning, the bandwidth frequency of the analog filter 132 is coupled to the receiver 101. The digital tuning system 250 is coupled to the receiver 101 via couplings 103, 105, 107, 109, 111, 129, 135, 137, 175, 179 and 197.

Figure 2:
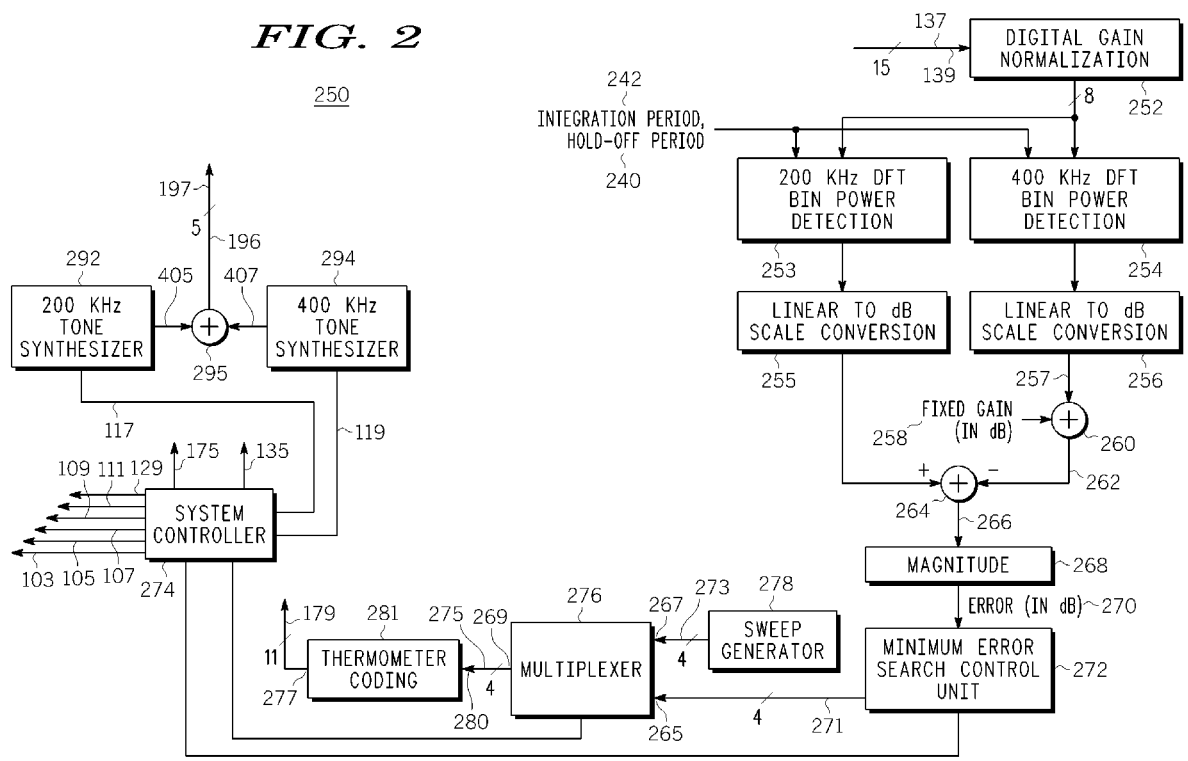
FIG. 2 shows a simplified functional block diagram of the digital tuning system of FIG. 1.

FIG. 2 shows a simplified functional block diagram of the digital tuning system 250. The digital tuning system 250 comprises a digital gain normalization circuit 252 that receives a signal from the receiver 101. The signal from the receiver 101 is a cap_tune_din 139, which is an output from the decimation filter 136. The decimation filter 136 of the receiver 101 is coupled to the normalization circuit 252 of the digital tuning system 250 via a 15-bit coupling 137. The normalization circuit 252 is coupled to a 200-kHz discrete Fourier transform (DFT) single-frequency bin power detection circuit 253 in parallel with a 400-kHz DFT single-frequency bin power detection circuit 254, via 8-bit couplings. The 200-kHz DFT single-frequency bin power detection circuit 253 and the 400-kHz DFT single-frequency bin power detection circuit 254 are each coupled to a linear-to-dB scale conversion circuit 255 and 256, respectively. A fixed gain 258 and an output of the linear-to-dB scale conversion circuit 256 are coupled to an adder 260, which has as its output a larger gain signal 262. The larger gain signal 262 and an output from the linear-to-dB scale conversion circuit 255 are fed into adder 264. The larger gain signal 262 is made negative prior to being fed into an input of the adder 264. The output signal of the adder 264 is a cap_tune_pow_diff 266. The cap_tune_pow_diff 266 is a difference between the power estimate of the response at 200-kHz and the power estimate of the response at 400-kHz. The cap_tune_pow_diff 266 is a value measured in decibels. The output of the adder 264 is coupled to an input of a magnitude circuit 268, which has as its output an error value 270 that is an absolute value of its input. The output of the magnitude circuit 268 is coupled to an input of a minimum error search control unit 272. The minimum error search control unit 272 comprises combinatorial and sequential logic circuits under control of a system controller 274 coupled thereto. In the exemplary embodiment, the system controller 274 is a microprocessor. An output of the minimum error search control unit 272 is coupled to an input 265 of a multiplexer 276 via a four-bit coupling 271. The minimum error search control unit 272 outputs a four-bit value representing an optimal capacitance setting for the at least one R/C circuit of the analog filter 132. A sweep generator 278 is coupled to another input 267 of the multiplexer 276 via a four-bit coupling 273. During a closed loop training, or calibration, period, the sweep generator 278 steps through each possible R/C setting of the analog filter 132 while the R/C setting of the A/D converter 134 is held at a nominal setting. In the exemplary embodiment, the nominal setting for the A/D converter 134 is a maximum capacitance to prevent the A/D converter 134 from clipping. The sweep generator 278 outputs a sequence of four-bit values from binary "0000" to binary "1011". An output 269 of the multiplexer 276 is coupled to a thermometer coding circuit 281 via a four-bit coupling 275. The multiplexer 276 is under control of the system controller 274, which is coupled thereto. During the closed loop calibration period, the output signal of the multiplexer 276 is the output signal from the sweep generator 278. After determination by the digital tuning system 250 of the optimal capacitance setting in accordance with the invention, the output signal from the multiplexer 276 is the output from the minimum error search control unit 272. The output signal of the multiplexer 276 is a cap_tune_setting 280. The cap_tune_setting 280 is a four-bit value from binary "0000" to binary "1011". Each value of the cap_tune_setting 280 represents a capacitance setting of R/C circuits of the analog filter 132. An output 277 from the thermometer coding circuit 281 is coupled to a ctune input 182 of the analog filter 132 via an eleven-bit coupling 179. The thermometer coding circuit 281 maps, or converts, the four-bit cap_tune_setting 280 to a control signal on the eleven-bit coupling 179.

The system controller 274 is coupled to a Q_tune input 183 of the analog filter 132 via coupling 175. The system controller 274 is also coupled to the antenna switch 113, the first LNA 102, the second LNA 108, the mixer pole 114, the switch 122 and the IFA 120 via the couplings 103, 105, 107, 109, 111 and 129, respectively. The digital tuning system 250 also comprises a 200-kHz tone digital synthesizer 292 that produces a 200-KHz tone 405, and a 400-kHz tone digital synthesizer 294 that produces a 400-kHz tone 407 (see FIG. 4). The system controller 274 is coupled to the 200-kHz tone synthesizer 292 and to the 400-kHz tone synthesizer 294 via couplings 117 and 119, respectively. The 200-kHz tone 405 and the 400-kHz tone 407 are combined at an adder 295. An output signal from the adder 295 is a two-tone calibrating signal 196. The output from adder 295 is coupled to an input of another adder 198 via a 5-bit coupling 197. The two-tone calibrating signal 196 is combined with the DC correction value 124 in adder 198. Optionally, the two-tone calibrating signal 196 is scaled prior to being combined with the DC correction value 124. The digital tuning system 250 applies the calibration signal 196 through the DCOC D/A converter 126 at the input 130 of the analog filter 132. Because the calibration signal 196 is inserted into the receiver 101 through the DCOC D/A converter 126 already present in the receiver 101, an additional D/A converter is not required. The digital tuning system 250 operates during a power-up sequence of the receiver 101. Alternatively, the digital tuning system 250 operates during a period that the receiver 101 is not receiving any signals.

In the exemplary embodiment, the entire receiver 101 and the entire digital tuning system 250 including the analog filter 132 and the resistors and capacitors that affect bandwidth frequency, are on a single integrated circuit manufactured using complementary metal oxide semiconductor (CMOS)

technology. In the exemplary embodiment, the operating frequency range of the receiver 101 is approximately 800-2000 MHz.

Figure 3:
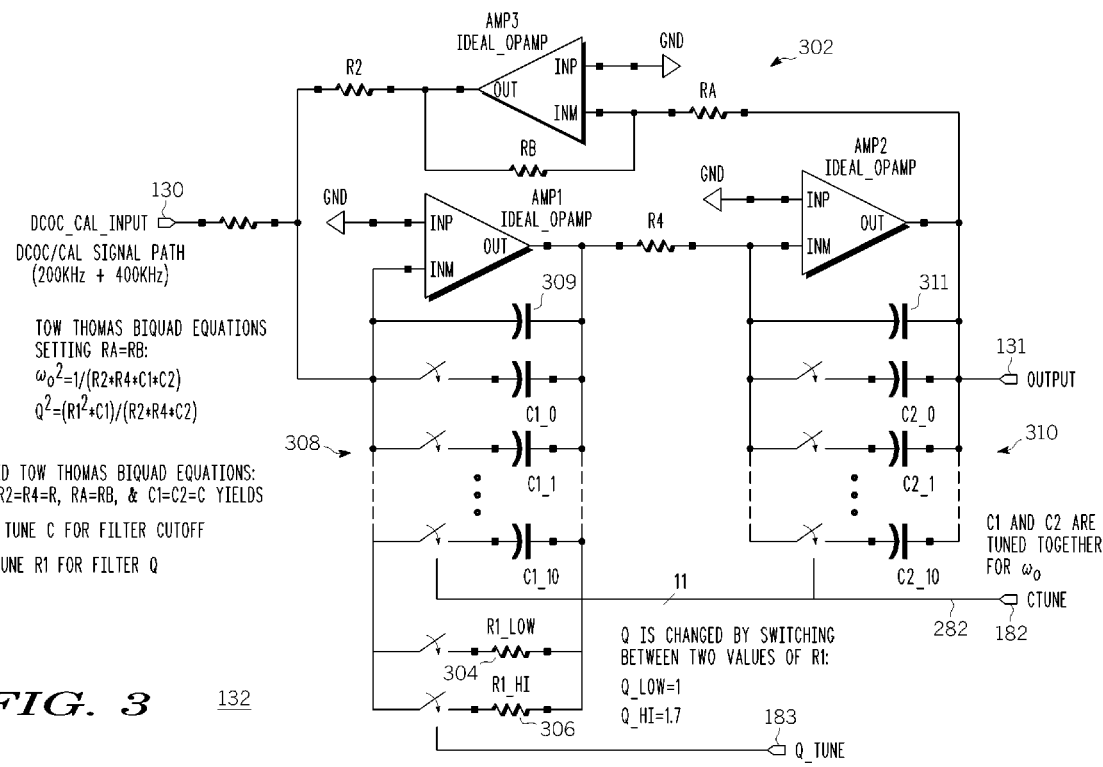
FIG. 3 is a schematic of the analog filter of FIG. 1.

FIG. 3 is a schematic of the analog filter 132. The analog filter 132 includes means for changing the Q of the analog filter. The means for changing the Q of the analog filter comprises a low resistor 304, a high resistor 306 and means for switching one of the low resistor and the high resistor into one of the at least one R/C circuit. In the exemplary embodiment, the analog filter 132 is an active filter comprising a biquad stage 302. The biquad stage 302 comprises at least one operational amplifier. In the exemplary embodiment, the active filter is a second-order, Tow-Thomas filter. The operation of the Tow-Thomas active filter and the operation of the biquad stage 302 are well known to persons of ordinary skill in the art of active filters; therefore, they will not be described in further detail.

Each of the at least one R/C circuit of the analog filter 132 comprises a plurality of bandwidth-determining components. In the exemplary embodiment, the bandwidth-determining components comprise a first array 308 of switchable capacitors and a second array 310 of switchable capacitors. The first array 308 of switchable capacitors is associated with a first R/C circuit that has a first time constant, and the second array 310 of switchable capacitors is associated with a second R/C circuit that has a second time constant. Each of the first R/C circuit and the second R/C circuit also includes a non-switchable capacitor 309 and 311, respectively. At any time, one of the low resistor 304 and the high resistor 306 is used in the analog filter 132. Use of the low resistor 304 causes the lowpass filter to operate in a low-Q, or normal, mode. Use of the high resistor 306 causes the lowpass filter to operate in a high-Q, or tuning, mode. In the exemplary embodiment, the low-Q mode has a quality factor of 1.0, and the high-Q mode has a quality factor of 1.7. The resistor (either the low resistor 304 or the high resistor 306) selected for use in the analog filter 132 is controlled by a signal at the Q_tune input 183. In the exemplary embodiment, the first array 308 of switchable capacitors comprises eleven (11) capacitors, C1_0 to C1_10, with each capacitor having an equal first value, and eleven (11) switches, S1_0 to S1_10, for connecting the associated capacitor, C1_0 to C1_10, respectively, to the first R/C circuit of the analog filter 132. In the exemplary embodiment, the second array 310 of switchable capacitors comprises eleven (11) capacitors, C2_0 to C2_10, with each capacitor having an equal second value and eleven (11) switches, S2_0 to S2_10, for connecting the associated capacitor, C2_0 to C2_10, respectively, to the second R/C circuit of the analog filter 132. A selected first capacitance of the first array 308 is the capacitance of one of C1_0, C1_0+C1_1, C1_0+C1_1+C1_2, C1_0+C1_1+C1_2+C1_3 . . . etc. Similarly, a selected second capacitance of the second array 310 is the capacitance of one of C2_0, C2_0+C2_1, C2_0+C2_1+C2_2, C2_0+C2_1+C2_2+C2_3 . . . etc. A selected first capacitance in the first array 308 is associated with a selected second capacitance in the second array 310. The first array 308 and the second array 310 are ganged together so that a single signal, cap_tune_setting 280, at the ctune input 182 selects both the selected first capacitance from the first array 308 and the selected second capacitance from the second array 310 for use in the R/C circuits of the analog filter 132. Each bit of the eleven-bit coupling 179 activates one of the switches associated with each capacitor of each array 308 and 310.

Figure 4:
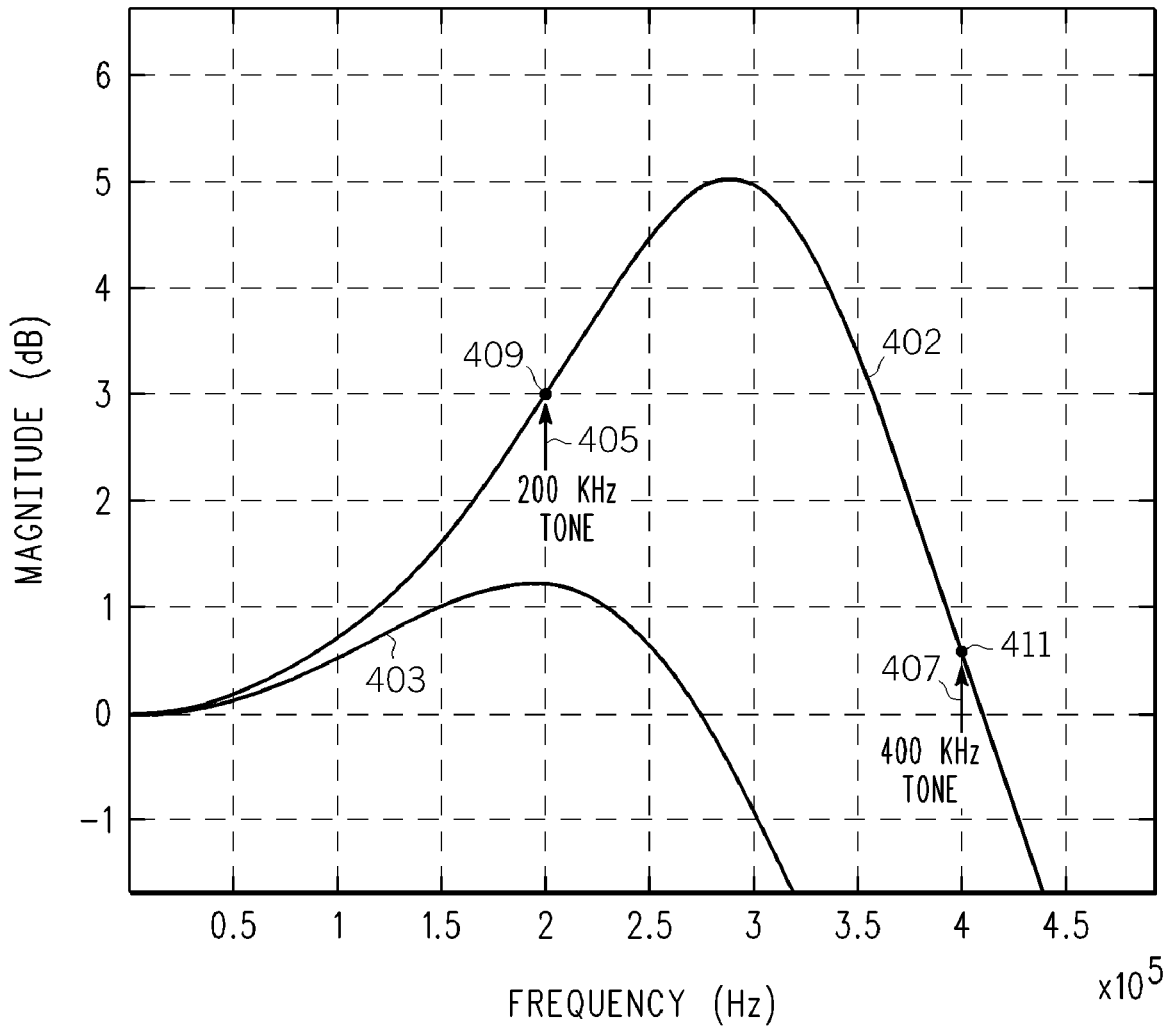
FIG. 4 is a graph of magnitude responses of the analog filter of FIG. 1 during R/C calibration and during normal receiver operation.

FIG. 4 is a graph 401 of magnitude response (in decibels) versus frequency (in Hertz). FIG. 4 shows a representative magnitude response 402 of the analog filter 132 during R/C calibration and a representative magnitude response 403 of the analog filter during normal receive operation. The analog filter 132 also has a phase response (not shown). Magnitude is the square root of power. Hereinafter, the term "response" shall mean "magnitude response". FIG. 4 graphically illustrates an advantage of tuning the analog filter 132 when the analog filter is in a high-Q mode rather than in a low-Q mode. Placing the analog filter 132 in the high-Q mode advantageously produces a high peak in the curve of the response 402. In the high-Q response 402, the slope of the curve at frequencies near the high peak is considerably greater than the slope of curve in the low-Q response 403 at the same frequencies. The two-tone calibration signal 196 comprises a 200-kHz tone 405 and a 400-kHz tone 407. The two tones 405 and 407 of the calibration signal 196 are selected such that they are located at frequencies on either side of a cutoff frequency of the analog filter 132. In the exemplary embodiment, the −3 dB bandwidth of the analog filter 132 during the normal operation mode is 350-kHz. The −3 dB bandwidth of the analog filter 132 during the calibration mode is approximately 460-kHz. In the exemplary embodiment, the exact frequencies of the calibration tones 405 and 407 are frequencies that are integer-division related to one of the system clocks. However, in general, the lower frequency tone 405 should be no lower than 150-kHz and no higher than 250-kHz, and the higher frequency tone 407 should be no lower than 350-kHz and no higher than 450-kHz, for use with an analog filter 132 having a cutoff frequency of 460-kHz during the calibration mode.

The 200-kHz tone 405 and the 400-kHz tone 407, which are represented in FIG. 4 by vertical lines, lie evenly on each side of the high peak of the response 402 of the analog filter 132 in the high-Q mode. There are two effects when the analog filter 132 is tuned in the high-Q mode. The first effect is the amount by which the response 402 changes for each tuning step. The response 402 is measured as power. As a result of placing the filter in a high-Q mode, an advantageous larger change in power occurs for a given change in frequency. The larger change in power occurs for a given change in frequency because the frequencies of the tones 405 and 407 are located on a high slope, or steep, portion of the curve of the response 402. On the other hand, a smaller change in power occurs for a given change in frequency, when the analog filter 132 is in the low-Q mode. The second effect is that, as the analog filter 132 is tuned, the change in power of the response 409 to the 200-kHz tone 405 moves in an opposite direction with respect to the change in power of the response 411 to the 400-kHz tone 407, such that the difference between the responses is accentuated at each tuning step. Both effects advantageously contribute to resolving any ambiguity between the responses 409 and 411 to the tones 405 and 407, respectively. The digital tuning system 250 selects one absolute difference from a plurality of absolute differences between the tones 405 and 407. Use of two tones 405 and 407, rather than one tone, by the digital tuning system 250 also removes any gain variation present in the analog filter 132. The gain variation is caused, in part, by part variation and/or the environment, such as temperature. Any gain variation would affect the response 409 and 411 to each tone 405 and 407, respectively, by approximately a same amount. Therefore, neither the presence of the gain nor the amount of the gain contributes to the difference, or to the absolute difference, between the responses 409 and 411 to the tones 405 and 407, respectively.

Referring now to FIGS. 1 and 4, prior to enabling the closed loop calibration process, the signal at the input 118 to the IFA 120 is sufficiently attenuated such that it does not interfere with the performance of the digital tuning system 250. The attenuation is accomplished by placing the antenna switch 113, the first LNA 102, the second LNA 108 and the mixer 110, and the mixer pole 114 to minimum gain states, and by disconnecting the input 118 to the IFA 120. During the closed loop calibration process, the system controller 274 places the IFA 120 at a maximum gain fixed setting (a 12-dB fixed gain setting in the exemplary embodiment). In addition, the analog filter 132 is placed in the high-Q mode that produces the response 402. The high-Q mode allows tones 405 and 407 to be concurrently applied at frequencies on both sides of the sharper slopes that result from the high peak of response 402. The concurrent application of the tones 405 and 407 results in a faster and more accurate tracking performance. During normal receiver operation, the low-Q representative response 403 is used to achieve flatter in-band response as well as improved out-of-band selectivity performance.

During the closed loop calibration period, the 200-kHz tone 405 and the 400-kHz tone 407 are combined, optionally scaled, added to the DC correction value 124, and applied to the DCOC D/A converter 126 for a given I/Q quadrature channel. The tones 405 and 407 are then passed through the analog filter 132 while the analog filter is in the high-Q mode. After the tones 405 and 407 are filtered through the analog filter 132, the calibration signal 196 is processed through the A/D converter 134 and decimated down to a lower sampling rate by the decimation filter 136. The lower sampling rate signal is then normalized appropriately by the normalization circuit 252. The input signal to the normalization circuit 252 is cap_tune_din 139, which has a 15-bit dynamic range. After digital gain normalization, the output signal from the normalization circuit 252 has an 8-bit dynamic range. The reduction in dynamic range minimizes the hardware needed for the digital tuning circuit 250.

The output signal from the normalization circuit 252 is fed into the two single-frequency bin DFT power detection circuits 253 and 254 to detect the magnitude of the 200-kHz tone 405 and the 400-kHz tone 407, respectively. Following the detections of the magnitude, the results are converted to decibel scale to allow comparison of the resulting magnitudes without performing any costly division operation. A fixed gain, in decibels, is added to the measured magnitude of the 400-kHz tone 407 such that its magnitude is normalized to be equal to the measured magnitude of the 200-kHz tone 405 for the ideal case, i.e., no bandwidth error in the response of the analog filter 132. The designer has a pre-existing knowledge of the poles and frequency response of the analog filter 132. Therefore, the designer knows the expected difference, in decibels, of the response of the analog filter 132 to the 400-kHz tone 407 versus the response of the analog filter to the 200-kHz tone 405, when the analog filter is performing ideally. In the exemplary embodiment, the designer knows that the ideal response of the analog filter 132 to the 400-kHz tone 407 is 2.5 dB less that the response of the analog filter to the 200-kHz tone 405. Therefore, in the exemplary embodiment, the digital tuning circuit 250 adds a fixed gain of 2.5 dB to the output 257 of the 400-kHz DFT bin 254. In general, for other embodiments, a different amount of fixed gain is added. The response 411 of the analog filter 132 to the 400-kHz tone 407 shown in FIG. 4 is 2.5 dB less that the response 409 of the analog filter to the 200-kHz tone 405; therefore response 402 is an optimal response.

Following normalization, the measured magnitudes of the two DFT single-frequency bins are compared using the adder 264 to compute the magnitude of the error signal. The output of the magnitude circuit 268 is the error signal in the digital tuning system 250. For the ideal case, the magnitude of the error signal is zero. Hence, the closed loop calibration process involves stepping the analog filter 132 through all its possible resistor and/or capacitor settings, and then selecting the cap_tune_setting 280 that reflects the lowest error measurement. The closed loop calibration process seeks to determine which capacitor value of the plurality of capacitor values in the analog filter 132 provides the 2.5 dB difference expected for ideal performance of the analog filter of the exemplary embodiment. Alternatively, the closed loop calibration process seeks to determine the capacitor value of the plurality of capacitor values in the analog filter 132 that provides a difference that is closest to the 2.5 dB difference expected for ideal performance of the analog filter of the exemplary embodiment.

Figure 5:
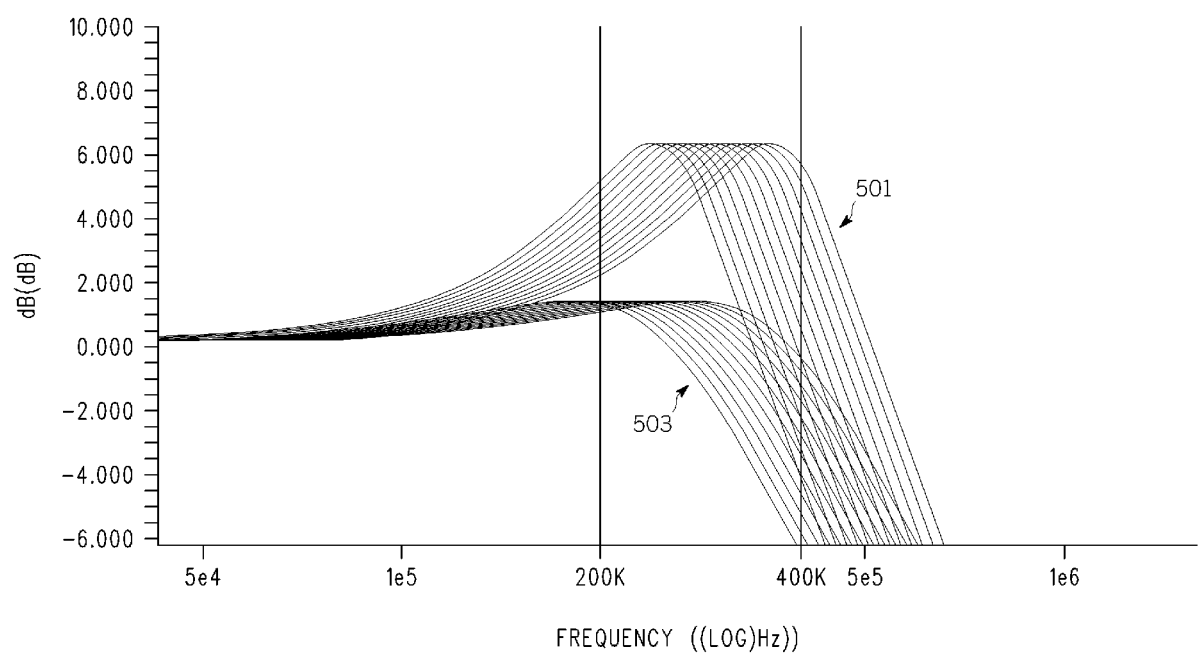
FIG. 5 is a graph of a family of magnitude responses of the analog filter of FIG. 1.

FIG. 5 is a graph 500 of magnitude response (in decibels) versus the logarithm of frequency (in Hertz). FIG. 5 shows a family 501 of twelve (12) typical high-Q responses and a family 503 of twelve (12) typical low-Q responses of the analog filter 132. The shape of each response depends upon the value of the cap_tune_setting 280. In the exemplary embodiment, the number of responses in each family 501 and 503 is equal to the number of capacitors in each R/C circuit of the analog filter 132. In general, the number of responses in each family 501 and 503 is equal to the number of frequency-determining components of the analog filter 132 controllable by the digital tuning system 250.

Figure 6:
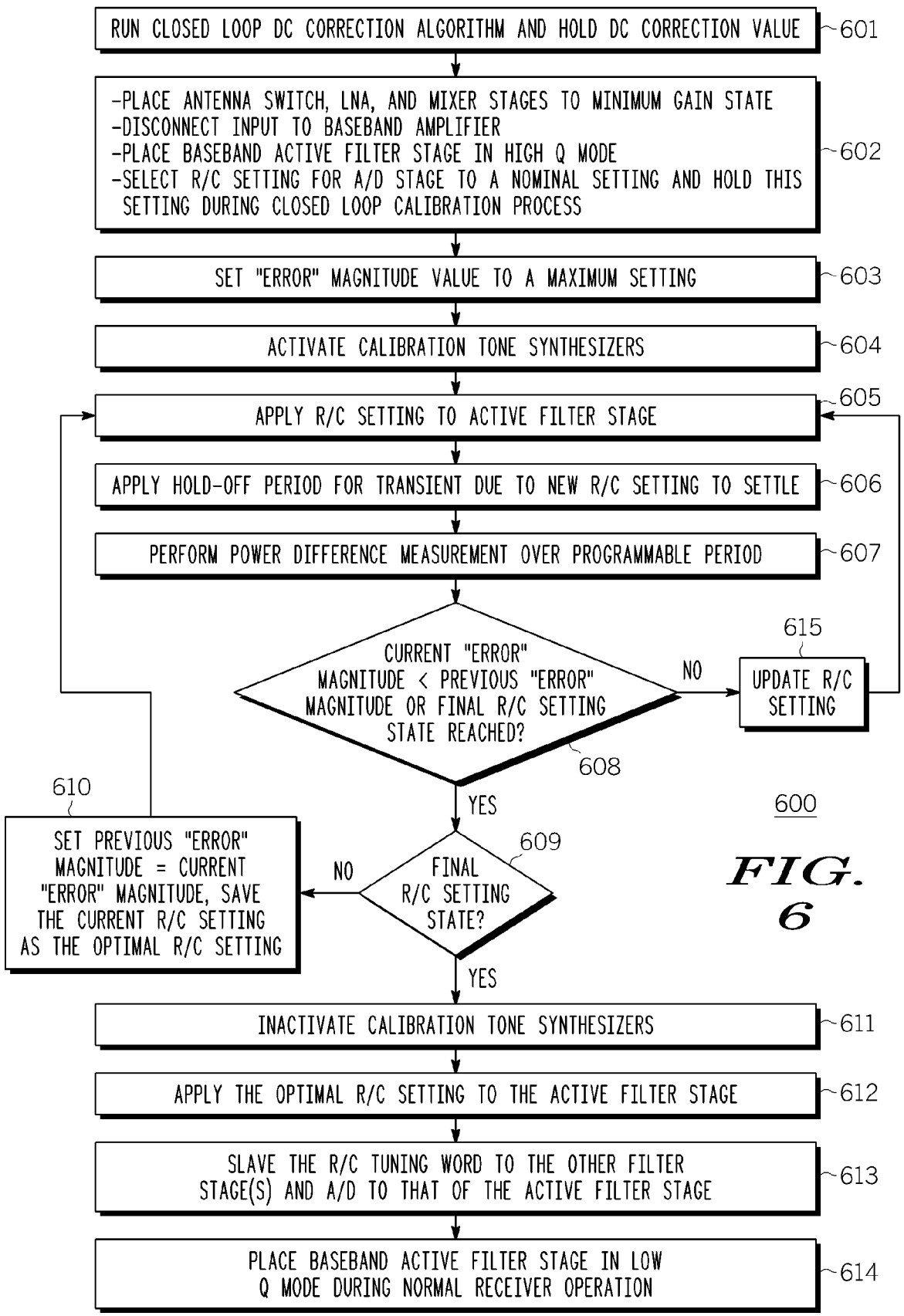
FIG. 6 is a flow diagram of a method of operating the digital tuning system of FIG. 1.

FIG. 6 is a flow diagram 600 of the method of operating the digital tuning system 250, in accordance with the invention. The method comprises the following steps. At step 601, a closed loop DC correction algorithm is run, and the DC correction value is held. An example of a DC correction algorithm that can be used with the receiver 101 is described in U.S. Pat. No. 6,560,447, issued May 6, 2003, to Rahman et al., entitled DC OFFSET CORRECTION SCHEME FOR WIRELESS RECEIVERS, and assigned to the assignee of the present application, which is hereby fully incorporated by reference herein. The following actions, controlled by the system controller 274, take place at step 602: placing the antenna switch 113, the first LNA 102, the second LNA 108 and the mixer stage to a minimum gain state; disabling the output 116 of the mixer pole 110 by disconnecting the input 118 to the IFA 120; setting the analog filter 132 to the high-Q mode; placing the R/C setting of the A/D converter 134 in the nominal setting; and holding the nominal setting during the closed loop calibration period. At step 603, the error value 270 is set to a maximum setting. At step 604, the system controller 274 activates the 200-kHz and the 400-kHz digital synthesizers 292 and 294. At step 605, an R/C setting is applied. At step 606, a hold-off period 240 is used, to allow the transient associated with the new filter bandwidth setting of the analog filter 132 to settle. In the exemplary embodiment, the hold-off period 240 is 10-μsec. Following this settling period, the power difference between the two tones 405 and 407 is measured, at step 607, over a programmable integration period 242. The programmable integration period 242 is typically chosen to be a common multiple of cycle periods of the two tones 405 and 407. In general, the programmable integration period 242 is about ten (10) cycles of the lower tone of the two-tone calibration signal 196. In the exemplary embodiment, the programmable integration period 242 is 50-μsec. Advantageously, the total calibration time, i.e., the time for completion of the closed loop R/C tuning algorithm, is merely approximately 720-μsec.

Next, at step 608, the minimum error search control unit 272 compares the current measured error magnitude to the previous error magnitude. If the current error magnitude is less than the previously stored error magnitude, and, at step 609, if the final R/C setting state is not yet reached, then, at step 610, the minimum error search control unit 272 updates the contents of the latter with the contents of the former, and the current R/C setting is saved as the optimal R/C setting. On the other hand, if the final R/C setting is reached, then, at step 611, the system controller 274 inactivates the calibration tone synthesizers 292 and 294. Referring again to step 608, if the current error magnitude is not less than the previously stored error magnitude, then, at step 615, the R/C setting is updated, and the flow returns to step 605. This process continued for each possible R/C setting until the last R/C setting step is completed. Next, at step 612, the minimum error search control unit 272 applies the optimal R/C setting to the analog filter 132. At step 613, the R/C settings for the other receiver stages and for the A/D converter 134 are slaved to this optimal R/C setting. Finally, at step 614, the Q of the analog filter 132 is set to the low-Q mode during normal receiver operation to minimize in-band peaking while maximizing out-of-band selectivity.

After the optimal R/C setting is achieved for the analog filter 132, other baseband receiver blocks, including the A/D converter 134 and other passive or active filter stages, are slaved to the optimal R/C setting. In the exemplary embodiment, the A/D converter 134 has one or more arrays (not shown) of capacitors that are slaved to the optimal R/C setting via coupling 135. The number of capacitors in each array of capacitors in the A/D converter 134 need not be equal to the number of capacitors in the arrays 308 or 310 in the analog filter 132. The capacitances of the slaved capacitors in the other receiver blocks, which values are slaved to the optimal capacitance setting of the analog filter 132, are not necessarily the same value as the optimal capacitance value of the capacitors in the analog filter. However, the capacitances of the slaved capacitors in the other receiver blocks do have the same percentage change in value as the percentage change in value of the capacitors in the analog filter 132, for each change in cap_tune_setting 280. Furthermore, resistances, rather than capacitances may be slaved in the other receiver blocks. In all cases, the system controller 274 is preprogrammed to select the proper value of the slaved component (resistance and/or capacitance) in the other receiver blocks. In another embodiment (not shown), values of R/C components in the transmitter 800 are also slaved to the optimal setting derived from the analog filter 132 in the receiver 101, notwithstanding that the optimal setting is based upon a component of the receiver rather than a component of the transmitter.

Figure 7:
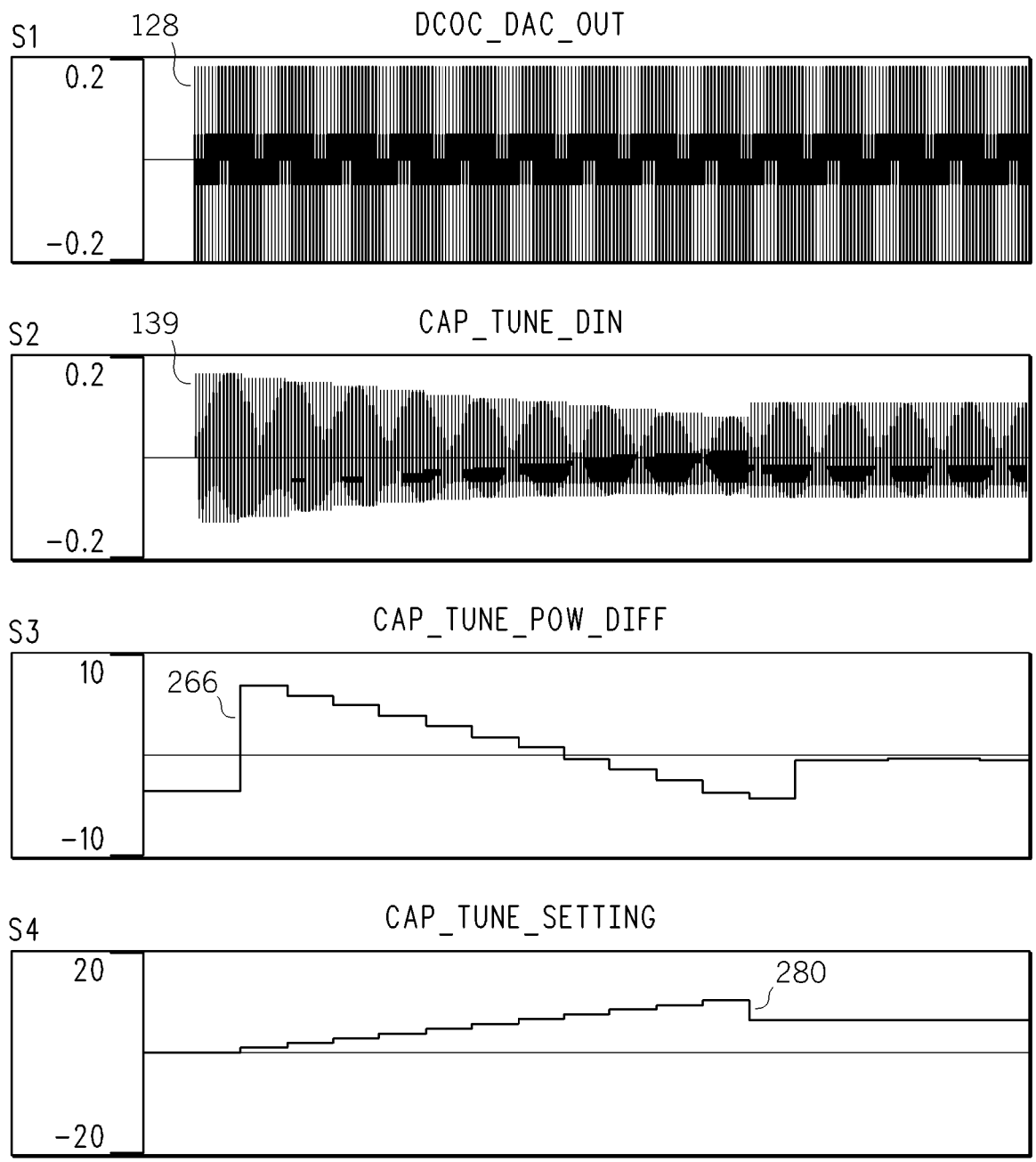
FIG. 7 shows exemplary simulation results of the digital tuning system of FIG. 1.

FIG. 7 shows exemplary simulation results of the digital tuning system 250. The S1 plot of FIG. 7 shows a time-domain plot of the analog signal, dcoc_dac_out 128. The vertical axis of the S1 plot represents millivolts, and the horizontal axis represents time. The S2 plot of FIG. 7 shows a time-domain plot of the digital signal, cap_tune_din 139. The vertical axis of the S2 plot represents a signed fractional digital value, where the total range is +/−1, and the horizontal axis represents time. The cap_tune_din 139 is the digital input signal to the digital tuning system 250. The S3 plot of FIG. 7 shows a time-domain plot of the digital signal, cap_tune_pow_diff 266. The vertical axis of the S3 plot represents decibels, and the horizontal axis represents time. The S3 plot shows a magnitude of the error signal (in decibels) for each step of the method in accordance with the invention. The minimum error signal, which occurs during the eighth step in the method, is shown on the S3 plot as the eighth setting from the left. The S4 plot of FIG. 7 shows a time-domain plot of the digital signal, cap_tune_setting 280 for each step of the method. The vertical axis of the S4 plot represents capacitor array settings, and the horizontal axis represents time. In the exemplary embodiment, the maximum number of settings is twelve (12). In accordance with the invention, the eighth setting is selected as the optimal setting for the exemplary simulation shown in FIG. 7 because at the eighth setting, the digital tuning system 250 settles at a state that reflects a minimum error magnitude. The number of settings is equal to the number of bandwidth-determining capacitors or resistors (collectively "components") in the R/C circuit(s) of the analog filter 132 that is being tuned. The number of bandwidth-determining components is determined by a make-tolerance of each element plus the absolute accuracy to which it is possible to tune the analog filter 132. In the exemplary embodiment, the number of bandwidth-determining components is twelve (12), with eleven (11) of them being switchable; however, the invention is equally applicable using a larger or smaller number of bandwidth-determining components.

The digital tuning system 250 of the invention includes a more precise R/C tracking algorithm that achieves a shorter run time than the run time of all known tracking methods that do not use dedicated analog circuitry. The advantages of the invention include dynamic control of the Q of the analog filter 132, use of two tones for the calibration signal 196, and the use of the DFT method for R/C tracking digital measurement and control. The DFT method of the invention improves performance, i.e., no mismatch issues, and minimizes die area in higher density CMOS processes. The smaller die area of the invention reduces manufacturing cost and results in significantly less current drain, compared to the larger die area that result from methods that use the fast Fourier transform (FFT) to calculate average power. In the digital tuning system 250 of the invention, each of the two DFT bins is implemented with a Goertzel filter. The Goertzel filter used with the invention requires only three multiplications, whereas known FFT methods disadvantageously require $(N/2)\log_2(N)$ complex multiplications. With the two-point DFT method of the invention, the magnitude is computed to only two bins; whereas, with known N-point FFT methods, the magnitude is computed to N, where N is greater than 2. Use of the DFT method allows the digital tuning system 250 to calculate average power more quickly than can be calculated by known tracking methods.

Advantageously, the digital tuning system 250 in accordance with the invention causes insignificant die area increase and insignificant current drain increase in higher density CMOS types of technologies. Unlike some known tracking circuits that use analog circuits, the digital tuning system 250 in accordance with the invention uses digital hardware. The complexity of the required digital circuitry used with the invention is less critical than the complexity of the analog circuitry used with known methods. A reduction in analog circuitry advantageously reduces design time, die area and current drain.

Unlike some known tracking circuits, the digital tuning system 250 in accordance with the invention does not use pseudorandom signals. Rather, the digital tuning system 250 in accordance with the invention uses two fixed-frequency (200-kHz and 400-kHz) tones that advantageously have no variance. The time reduction to achieve tracking is significantly reduced over known tracking circuits because each occasion that the digital tuning system 250 calculates average power, it does so over a smaller bandwidth with a fixed frequency.

The invention achieves high performance bandwidth tracking by tuning capacitor arrays using a low cost and practical digital method. The invention tracks receiver bandwidth errors to <6% correction accuracy using a high performance digital measurement and control method while minimizing die area and current drain in complementary metal oxide semiconductor (CMOS) technology. The correction accuracy does not degrade the 0.1% BER sensitivity level and achieves <5% EVM for both 3G and 3.5G operating modes. The invention helps provide a <5% receiver EVM performance that is desired to support high data rate HSDPA cases and the invention preserves receiver sensitivity requirements. The digital tuning system 250 provides post-tune accuracies for the biquad and mixer poles stages that are within 4% of the ideal target cutoff frequency of the analog filter 132. With the digital tuning system 250, changes to the cutoff frequency of the analog filter 132 caused by temperature and voltage variations (within a specified voltage and temperature operating range of the receiver 101) is not more than 1.5%.

Figure 8:
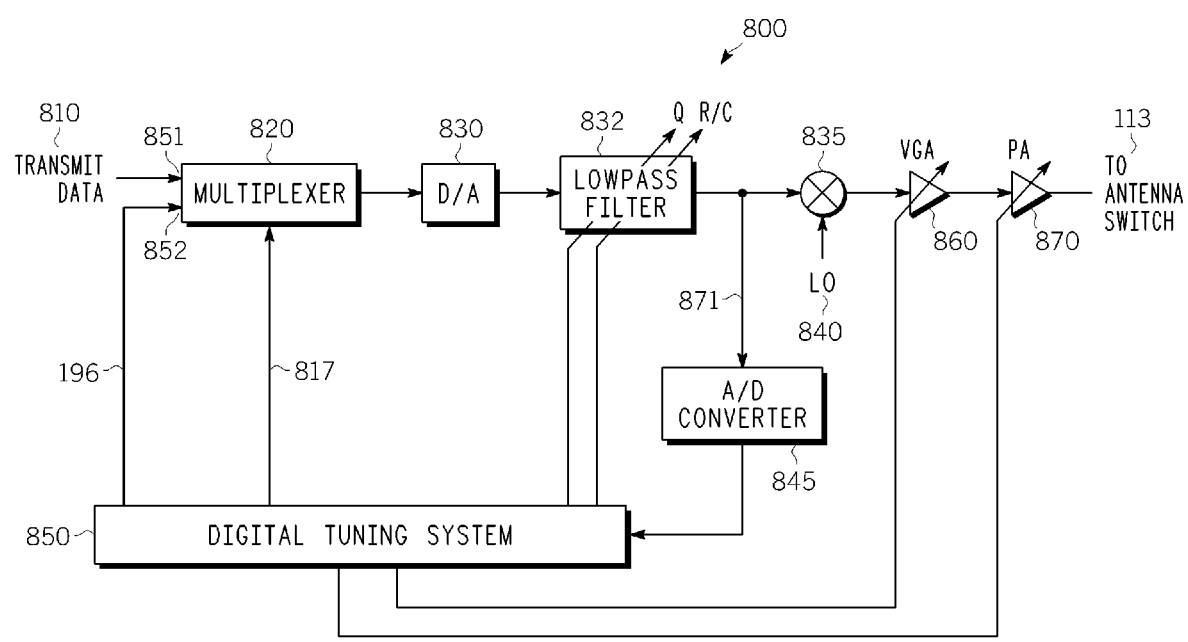
FIG. 8 is a simplified functional block diagram of a portion of a transmitter including a transmitter analog filter, and a simplified functional block diagram of a digital tuning system for tuning the transmitter analog filter.

FIG. 8 is a simplified functional block diagram of the transmitter 800 including a transmitter analog filter 832, and a simplified functional block diagram of a transmitter digital tuning system 850 for controlling the bandwidth frequency of the transmitter analog filter. The transmitter 800 is a baseband, or direct-launch, transmitter. The transmitter 800 comprises a D/A converter 830, the transmitter analog filter 832, a mixer 835 and a local oscillator 840. An output signal from the transmitter analog filter 832 is combined with a signal from the local oscillator 840 at the mixer 835. The output signal from the mixer 835 is fed into a variable gain amplifier (VGA) 860. An output from the VGA 860 is fed into a power amplifier 870. An output from the power amplifier (PA) 870 is coupled to the antenna switch 113 or directly to an antenna. The transmitter 800 is modified to accommodate the transmitter digital tuning system 850 by including a multiplexer 820. The multiplexer 820 is coupled to the transmitter digital tuning system 850 by selection line 817. Transmit data 810 is fed into a first input 851 of the multiplexer 820 during normal data transmission operation. The calibration signal 196 is fed into a second input 852 of the multiplexer 820. Prior to performing a transmit closed loop calibration process, the VGA 860 and PA 870 are placed in a minimal gain state to ensure that the calibration signal 196 is not transmitted, because such transmission would a source of interference to other devices. During the transmit closed loop calibration process, a system controller of the transmitter digital tuning system 850 places the transmitter analog filter 832 in a high-Q mode, and selects the second input 852 of the multiplexer 820 for feeding the calibration signal 196 into the D/A converter 830. The output signal from the D/A converter 830 is fed into an input of the transmitter analog filter 832. Next, the system controller of the transmitter digital tuning system 850 enables the closed loop R/C tuning process. The transmitter digital tuning system 850 includes a feedback A/D converter 845 that converts the analog signal 871 at the output of the transmitter analog filter 832 to digital form. Alternatively, in a half-duplex transceiver (not shown), an A/D converter (such as A/D converter 134) used in the receiver of the half-duplex transceiver is re-used as the feedback A/D converter 845 in the transmitter of the half-duplex transceiver. The values of R/C components in the transmitter 800 are slaved to an optimal setting derived from the optimal setting of the transmitter analog filter 832, rather than to an optimal setting derived from the optimal setting of the analog filter 132 in the receiver 101. The transmitter digital tuning system 850 and its associated method are substantially similar to the digital tuning system 250 and associated method for the receiver 101; therefore, the transmitter digital tuning system and its associated method will not be described in further detail.

While the principles of the invention have been described above in connection with specific apparatus, it is to be clearly understood that this description is made only by way of example and not as a limitation on the scope of the invention. For instance, although the exemplary embodiment uses an array of capacitors of a same value to control the cutoff frequency of the filter, the invention alternatively uses an array of capacitors of different values to control the cutoff frequency of the filter. Although the exemplary embodiment uses an array of capacitors to control the cutoff frequency of the filter, the invention alternatively uses a network of resistors or a combination of capacitors and resistors, to control the cutoff frequency of the filter. Although the exemplary embodiment is shown for use with an active filter having a biquad stage, the invention is equally applicable for use with an active filter without a biquad stage. Although the exemplary embodiment is shown for use with an active filter, the invention is equally applicable for use with a passive filter. Although the exemplary embodiment is that of a second-order lowpass filter, the invention is equally applicable to lowpass filters of another order. Although the exemplary embodiment is shown for use with a lowpass filter, the invention is equally applicable for use with a highpass or a bandpass filter, and in such case, the frequencies of the two-tone calibration signal are adjusted accordingly. The exemplary embodiment uses the invention with a zero-IF, or baseband, receiver; however, the invention can also be used in a very low frequency-IF receiver, in which case the analog filter would be a bandpass filter rather than a lowpass filter. Although the exemplary embodiment is shown on a single integrated circuit manufactured using complementary metal oxide semiconductor (CMOS) technology, the invention can also be used on a single integrated circuit manufactured using other manufacturing technologies. Although the exemplary embodiment shows both the analog filter and the digital tuning system on a same, single integrated circuit, the invention is equally applicable with the analog filter and the digital tuning system on separate integrated circuits.

We claim:

1. In a wireless device, a method for obtaining a desired bandwidth for an analog filter, the analog filter having an input, an output, a bandwidth-determining component and a quality factor, comprising the steps of:

a) predetermining a difference between an amplitude of a magnitude response of the analog filter at a first frequency and another amplitude of the magnitude response of the analog filter at a second higher frequency, based on ideal responses of the analog filter at each of said frequencies calculated from design of the analog filter;

b) increasing the quality factor of the analog filter from a normal Q to a high Q to produce a peak response at a peaking frequency between the first frequency and the second frequency;

c) sequentially setting a value of the bandwidth-determining component to one of a plurality of values, and, while the bandwidth-determining component is set to each value:

c1) concurrently applying to the input of the analog filter a first input signal at the first frequency and a second input signal at the second frequency, thereby producing a magnitude response at the output of the analog filter, and c2) calculating a difference between an amplitude of the magnitude response at the first frequency and another amplitude of the magnitude response at the second frequency;

d) comparing each of a plurality of differences calculated in step c to the predetermined difference to obtain a plurality of errors, wherein each error represents a numerical separation between each difference calculated in step c and the predetermined difference for a same value of the bandwidth-determining component;

e) based upon the plurality of errors, selecting one value from the plurality of values as an optimal value for the bandwidth-determining component, the selected one value being a value of the bandwidth-determining component associated with a smallest error; and f) setting the value of the bandwidth-determining component to the selected one value, to obtain the desired bandwidth for the analog filter when the quality factor is at the normal Q.

2. The method of claim 1, including, prior to step c), a step of attenuating other signals at the input of the analog filter.

3. The method of claim 1, including, subsequent to step e), a step of returning the quality factor of the analog filter to the normal Q.

4. The method of claim 1, in which the bandwidth-determining component is a capacitor and the optimal value is an optimal capacitance.

5. The method of claim 1, in which the bandwidth-determining component is a resistor and the optimal value is an optimal resistance.

6. The method of claim 1, in which the bandwidth-determining component has a nominal value and an actual value and in which the actual value is affected by one or more of the following: fabrication process variation, operating temperature, and operating voltage.

7. The method of claim 6, in which the wireless device includes another stage including another component having a nominal value and an actual value, and in which the actual value of the other component is proportionately affected by one or more of the following: fabrication process variation, operating temperature, and operating voltage.

8. The method of claim 7, including a step of selecting a proportionate value for the other component in the other stage of the wireless device based upon the optimal value selected for the bandwidth-determining component of the analog filter.

* * * * *